(12) United States Patent
Chou et al.

(10) Patent No.: US 8,747,064 B2
(45) Date of Patent: Jun. 10, 2014

(54) TWO-LAYER WIND-GUIDING SHROUD

(75) Inventors: Ku-Yang Chou, San Jose, CA (US); Richard S. Chen, San Jose, CA (US)

(73) Assignee: Super Micro Computer Inc., San Jose, CA (US)

( * ) Notice: Subject to any disclaimer, the term of this patent is extended or adjusted under 35 U.S.C. 154(b) by 510 days.

(21) Appl. No.: 13/157,372

(22) Filed: Jun. 10, 2011

(65) Prior Publication Data

US 2012/0312516 A1 Dec. 13, 2012

(51) Int. Cl.
*F01D 25/14* (2006.01)
(52) U.S. Cl.
USPC .................................... 415/208.1; 415/213.1
(58) Field of Classification Search
USPC ............ 415/208.1, 213.1, 214.1, 215.1, 220, 415/222, 223; 361/695, 697; 138/37, 39
See application file for complete search history.

(56) References Cited

U.S. PATENT DOCUMENTS

| | | | |
|---|---|---|---|
| 7,611,402 B2 * | 11/2009 | McClellan et al. | 454/184 |
| 7,990,706 B2 * | 8/2011 | Miyahara et al. | 361/695 |
| 2011/0247789 A1 * | 10/2011 | Yu et al. | 165/121 |

* cited by examiner

*Primary Examiner* — Edward Look
*Assistant Examiner* — Maxime Adjagbe
(74) *Attorney, Agent, or Firm* — Chun-Ming Shih; HDLS IPR Services

(57) ABSTRACT

A two-layer wind-guiding shroud includes a base. The interior of the base includes a first wind-guiding channel and a second wind-guiding channel longitudinally overlapped with each other. The first wind-guiding channel has a first wind entrance and a first wind exit. The second wind-guiding channel has a second wind entrance and a second wind exit. The first wind exit and the second wind exit are staggered. By this arrangement, the airflow generated by a fan can be guided into different wind-guiding channels toward different locations, thereby increasing the heat-dissipating efficiency of the fan.

9 Claims, 11 Drawing Sheets

TWO-LAYER WIND-GUIDING SHROUD

BACKGROUND OF THE INVENTION

1. Field of the Invention

The present invention relates to a heat-dissipating device, and in particular to a two-layer wind-guiding shroud.

2. Description of Prior Art

With the rapid advancement of information technology, electronic elements in a server such as a central processing unit (CPU), a graphic processing unit (GPU) or the like has a greater speed for processing data. On the other hand, the volume of each electronic element is required to be made compact, and the electronic elements are densely arranged per unit area. Further, the amount of heat generated during the operation of the electronic elements increases to a greater extent, so that the generated heat will be accumulated in the electronic elements. As a result, the electronic elements may be overheated to deteriorate the stability and efficiency of the server. Thus, a heat-dissipating device has to be installed in the server to dissipate the heat generated by the electronic elements, thereby lowering the temperature of the electronic elements.

The conventional heat-dissipating device (such as a heat sink) is fixed onto a heat-generating element to dissipate the heat generated thereby. However, such a heat dissipation is achieved by air convection in the heat sink together with the heat radiation, so that the heat-dissipating efficiency is insufficient. Accordingly, besides the heat sink installed in the server, at least one fan and a wind-guiding shroud are provided. As shown in FIGS. 1 and 2, the conventional wind-guiding shroud 10 comprises a shroud 20. One side of the shroud 20 has a fixing portion 30 and a wind-guiding channel 40 formed inside the shroud 20. A fan is provided at the fixing portion 30, so that the airflow generated by the fan can flow to the heat sink via the wind-guiding channel 40, thereby generating a compulsory airflow to lower the temperature of the heat-generating element quickly.

However, in the wind-guiding channel 40 of the wind-guiding shroud 10, the wind-entering direction and the wind-exiting direction are located in the same axial line. Thus, the fan can only blow a linear airflow. As a result, the area of air convection generated by the fan is so limited that the heat-dissipating efficiency is smaller than the heat-generating rate of the heat-generating element, which negatively affects the operation of the electronic device. In order to solve this problem, a plurality of fans and the wind-guiding shroud 10 are usually arranged toward the respective electronic elements to enhance the heat-dissipating efficiency. Although the above-mentioned heat-dissipating device can dissipate the heat in the server, the plurality of fans and the wind-guiding shroud 10 inevitably increase the cost of the whole device. Further, the size and area of the thus-formed server are larger with a complicated structure. Moreover, the fans generate vibration during their operation, which may affect the normal function of hard disks and thus deteriorates the performance of the server.

In view of the above, the present Inventor proposes a novel and reasonable structure based on his expert knowledge and deliberate researches.

SUMMARY OF THE INVENTION

The present invention provides a two-layer wind-guiding shroud, wherein the airflow generated by the fan is guided into different wind-guiding channels, so that the airflow can be delivered in different directions to thereby increase the heat-dissipating efficiency of the fan.

The present invention provides a two-layer wind-guiding shroud having a base. The interior of the base includes a first wind-guiding channel and a second wind-guiding channel longitudinally overlapped with each other. The first wind-guiding channel has a first wind entrance and a first wind exit. The second wind-guiding channel has a second wind entrance and a second wind exit. The first wind exit and the second wind exit are staggered.

The present invention has advantages features as follows. The two-layer wind-guiding shroud is configured to guide the airflow generated by the fan into different wind-guiding channels. In this way, the airflow can be delivered in different directions, so that the heat-dissipating paths and the heat-dissipating efficiency of the fan can be increased. Further, the two-layer wind-guiding shroud has a simple structure and a moderate area, and it dissipates the heat generated by a plurality of heat-generating elements simultaneously. Thus, the present invention solves the problems of heat dissipation in a high-performance server.

DETAILED DESCRIPTION OF THE INVENTION

The detailed description and technical contents of the present invention will become apparent with the following detailed description accompanied with related drawings. It is noteworthy to point out that the drawings is provided for the illustration purpose only, but not intended for limiting the scope of the present invention.

Figure 1:
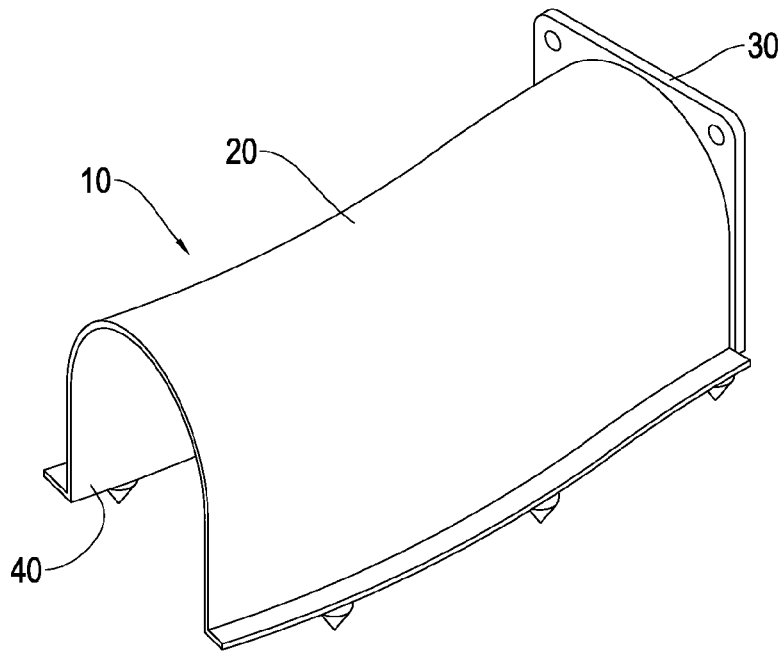
FIG. 1 is a perspective view of a conventional wind-guiding shroud.
Figure 2:
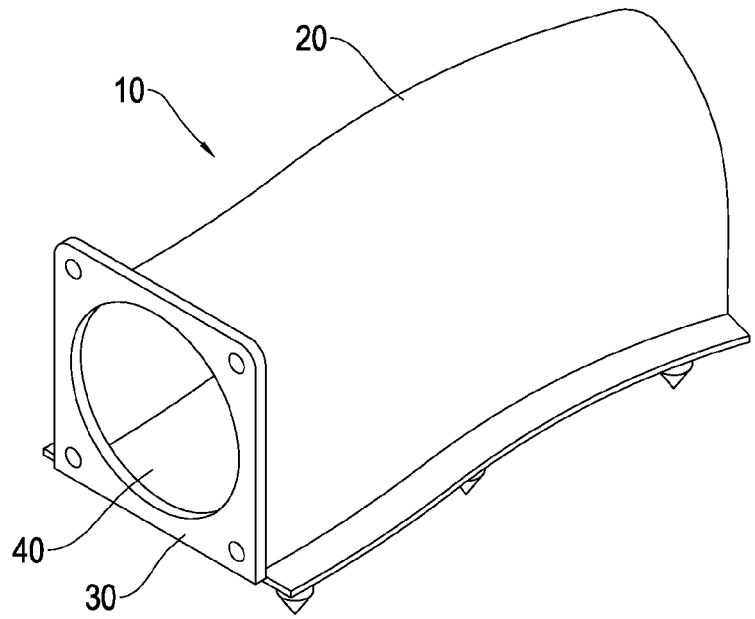
FIG. 2 is another perspective view of the conventional wind-guiding shroud.
Figure 3:
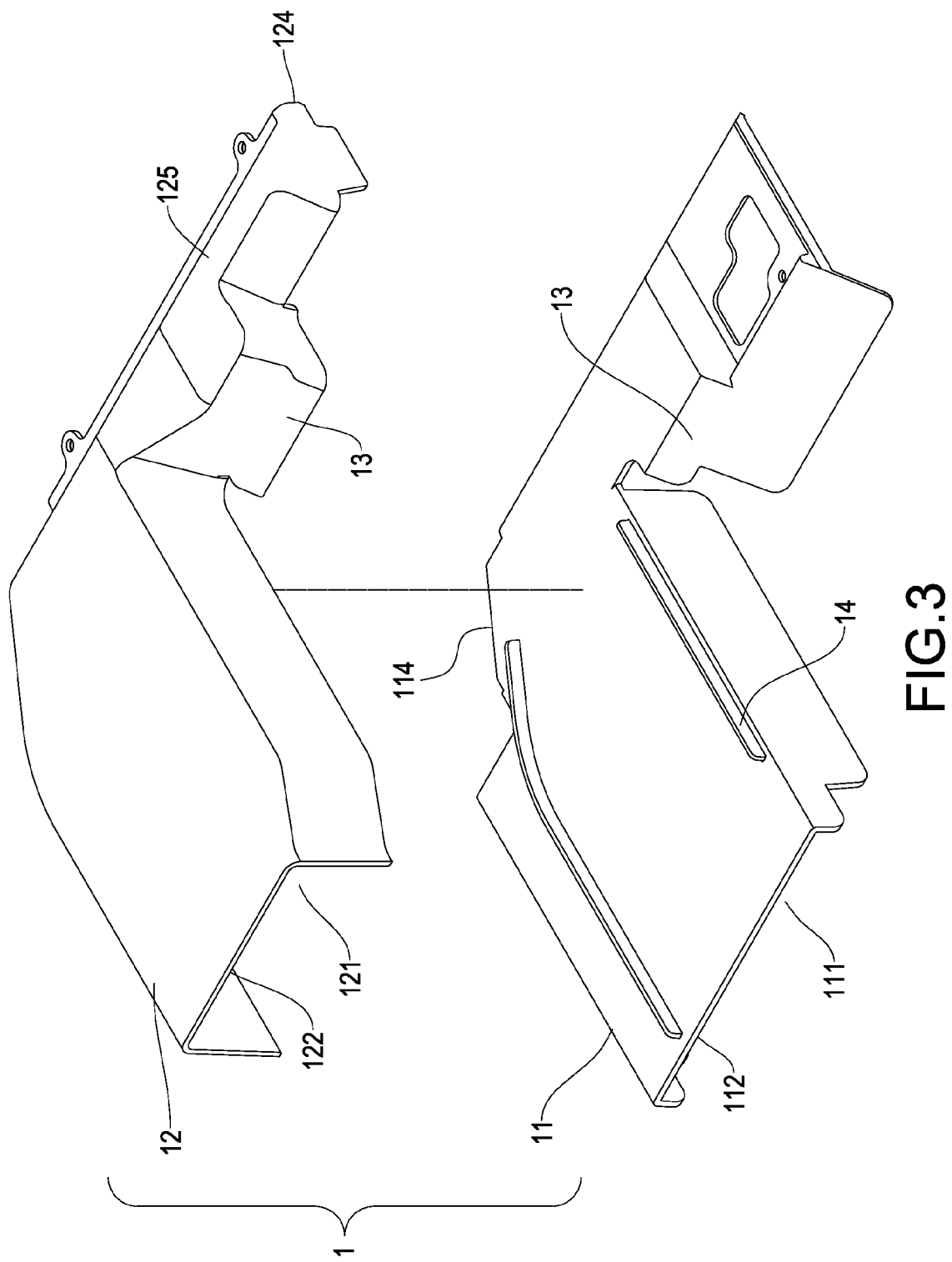
FIG. 3 is an exploded perspective view of the two-layer wind-guiding shroud of the present invention.
Figure 4:
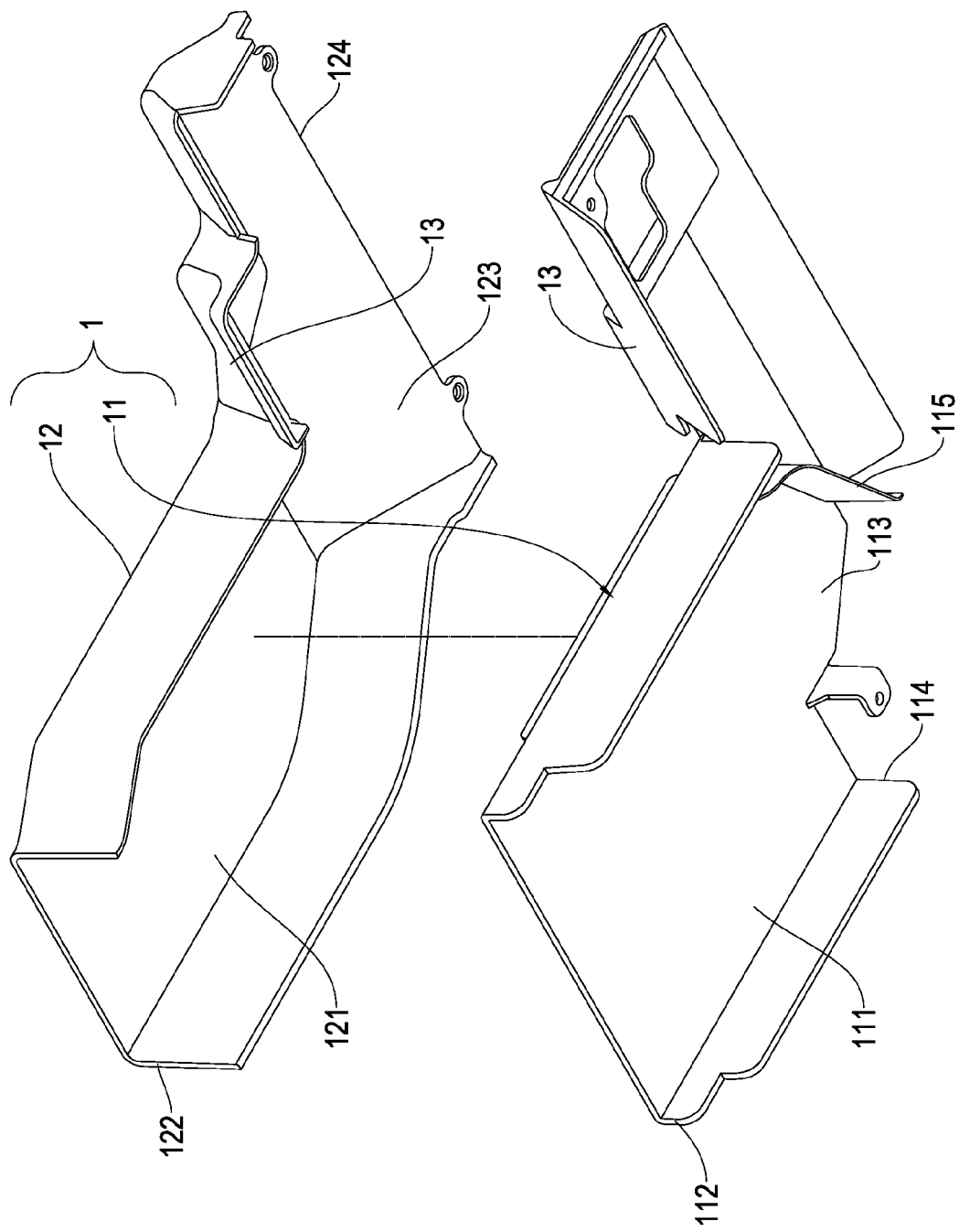
FIG. 4 is another exploded perspective view of the two-layer wind-guiding shroud of the present invention.
Figure 5:
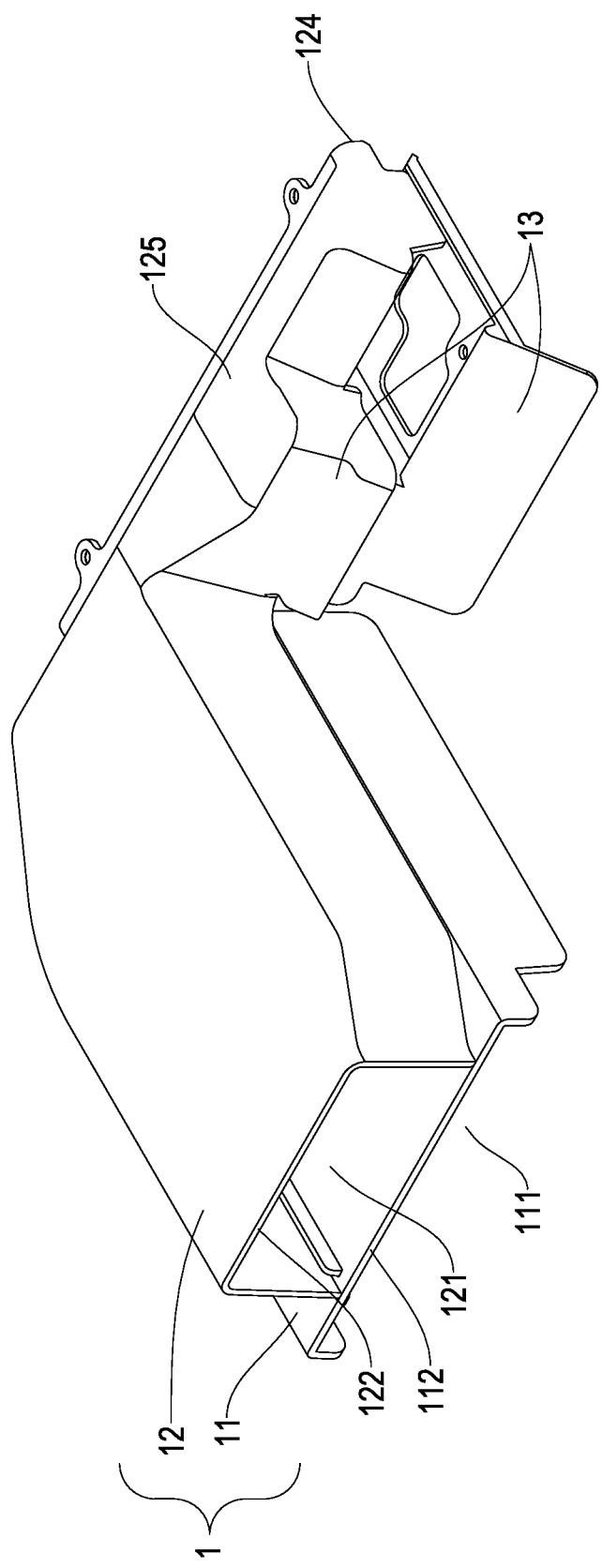
FIG. 5 is an assembled view of the two-layer wind-guiding shroud of the present invention.
Figure 6:
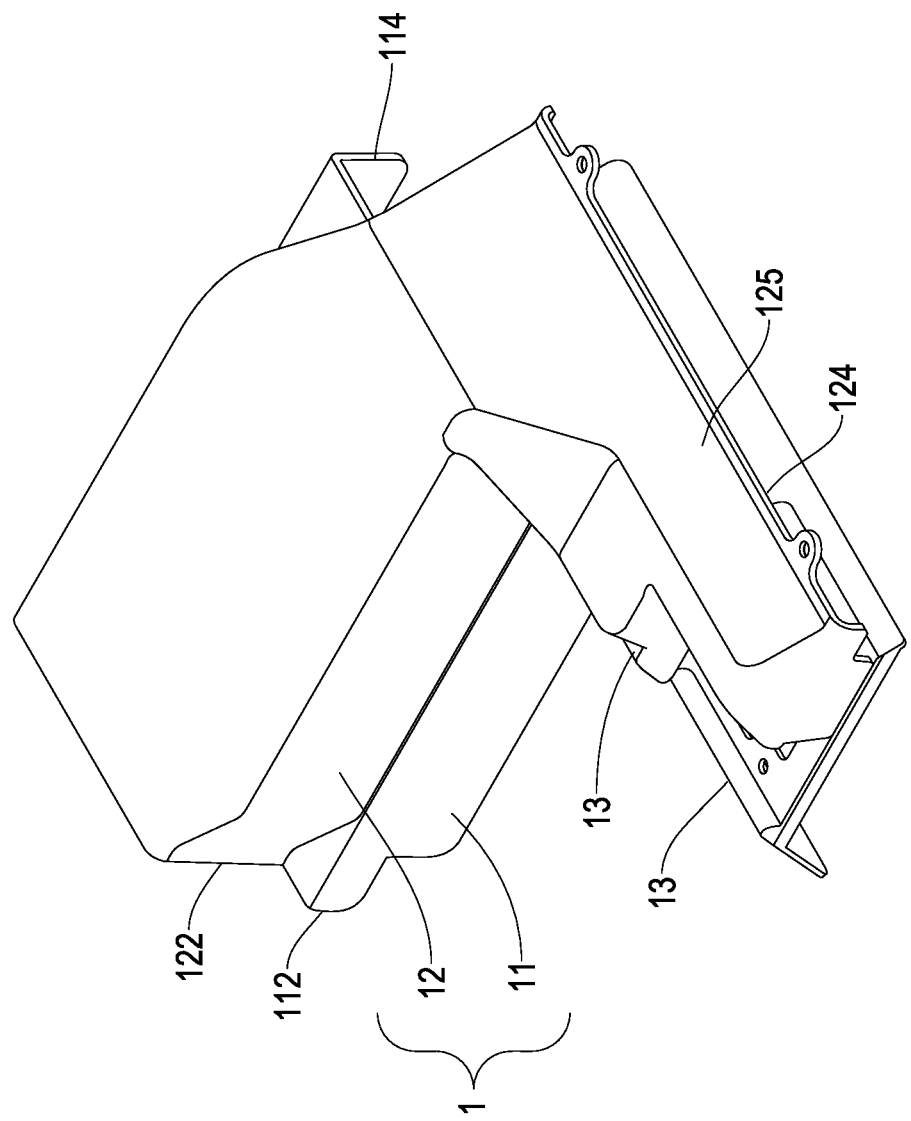
FIG. 6 is another assembled view of the two-layer wind-guiding shroud of the present invention.
Figure 7:
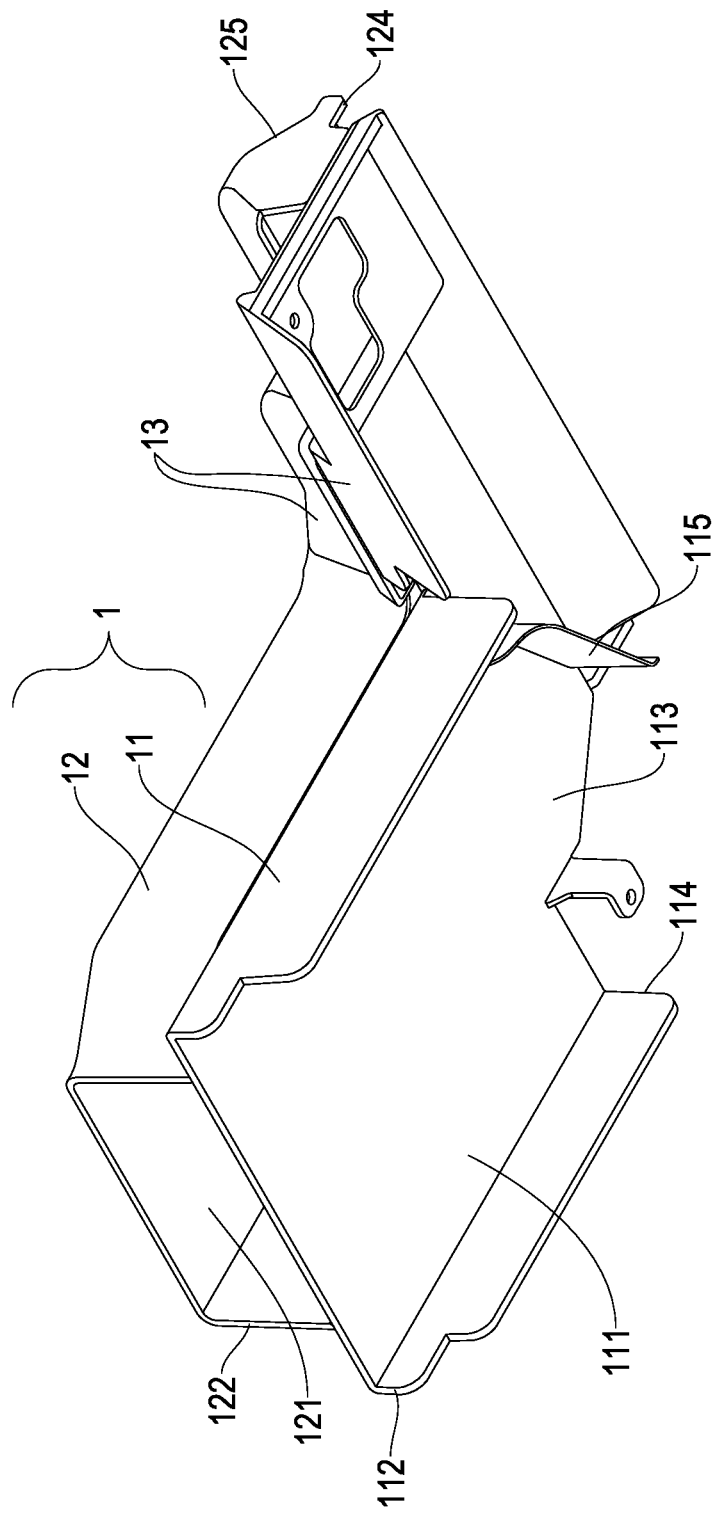
FIG. 7 is a further assembled view of the two-layer wind-guiding shroud of the present invention.
Figure 8:
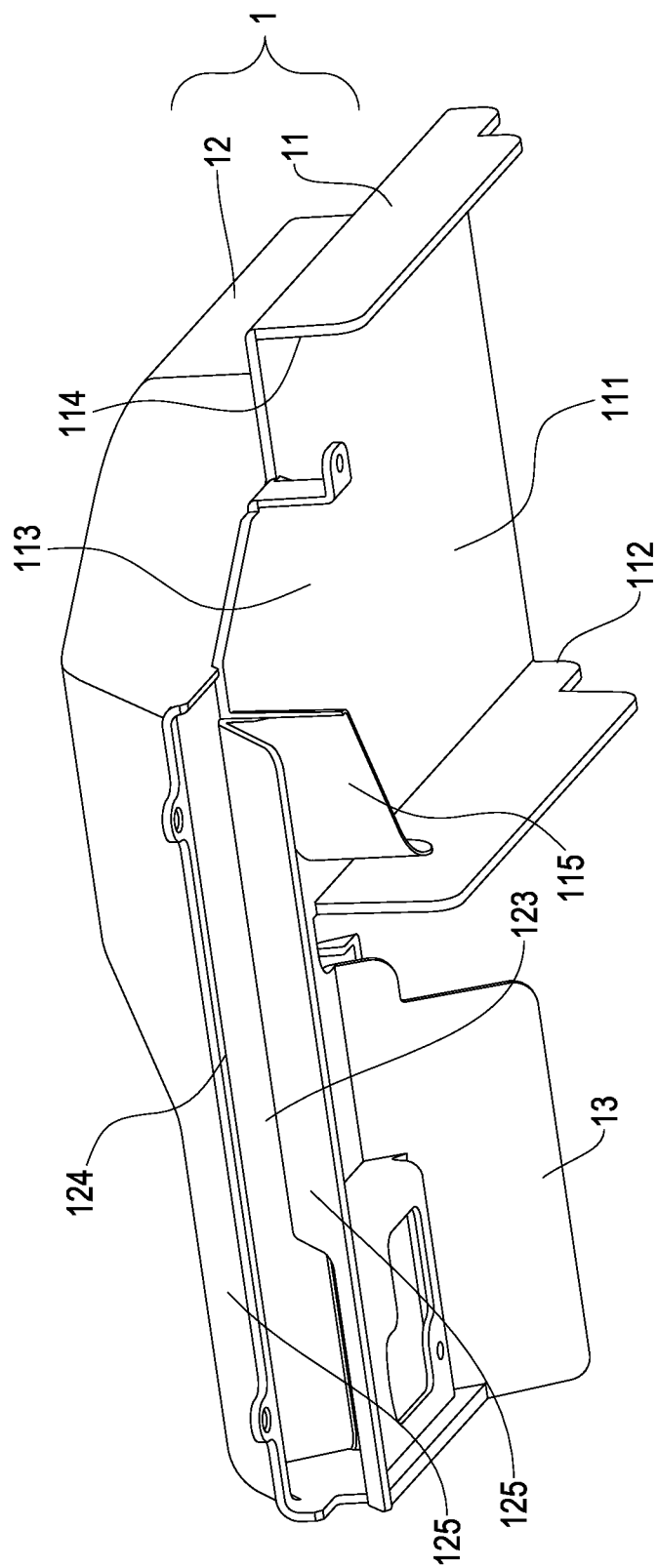
FIG. 8 is still a further assembled view of the two-layer wind-guiding shroud of the present invention.
Figure 9:
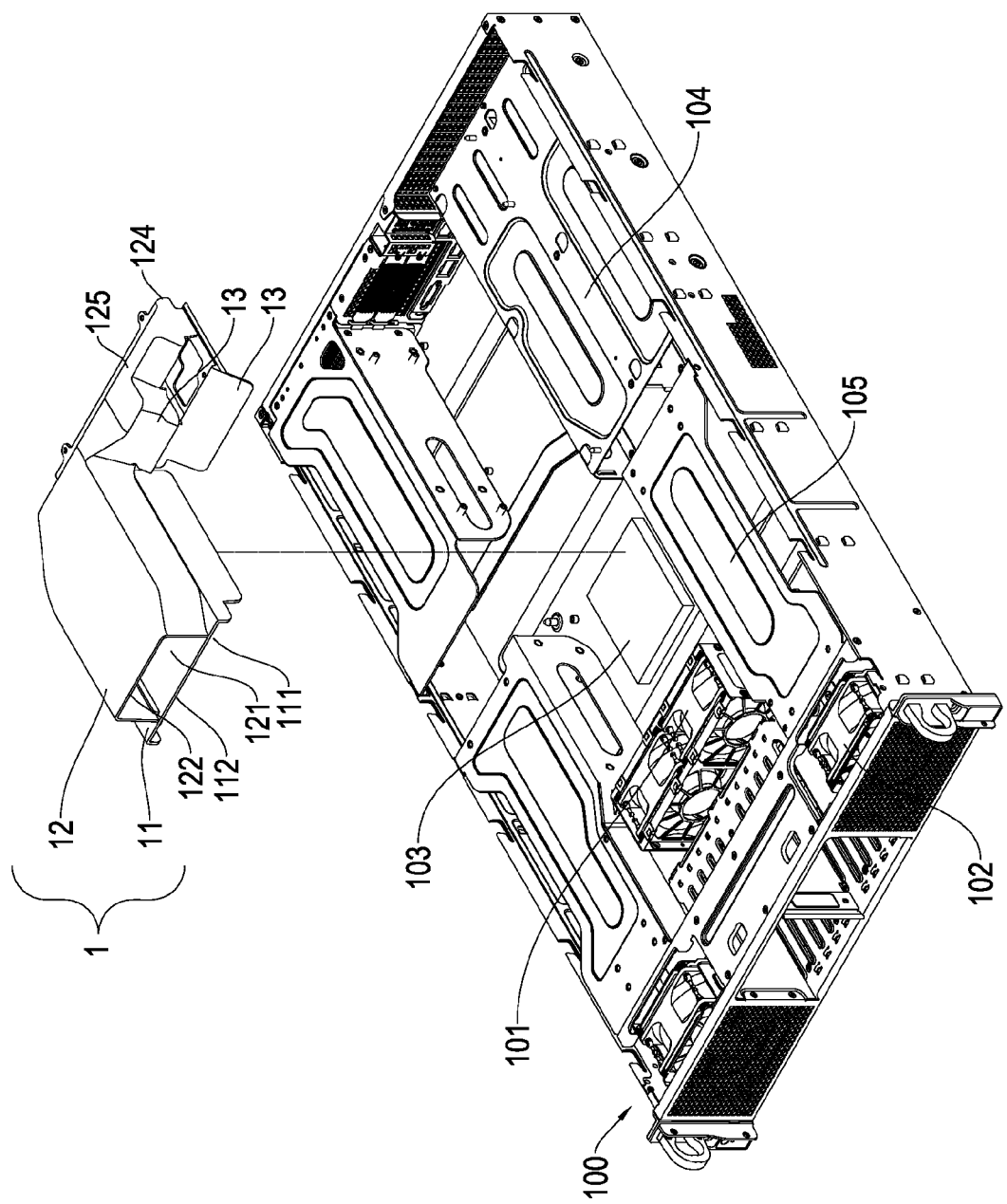
FIG. 9 is a schematic view showing the operating state of the two-layer wind-guiding shroud of the present invention.
Figure 10:
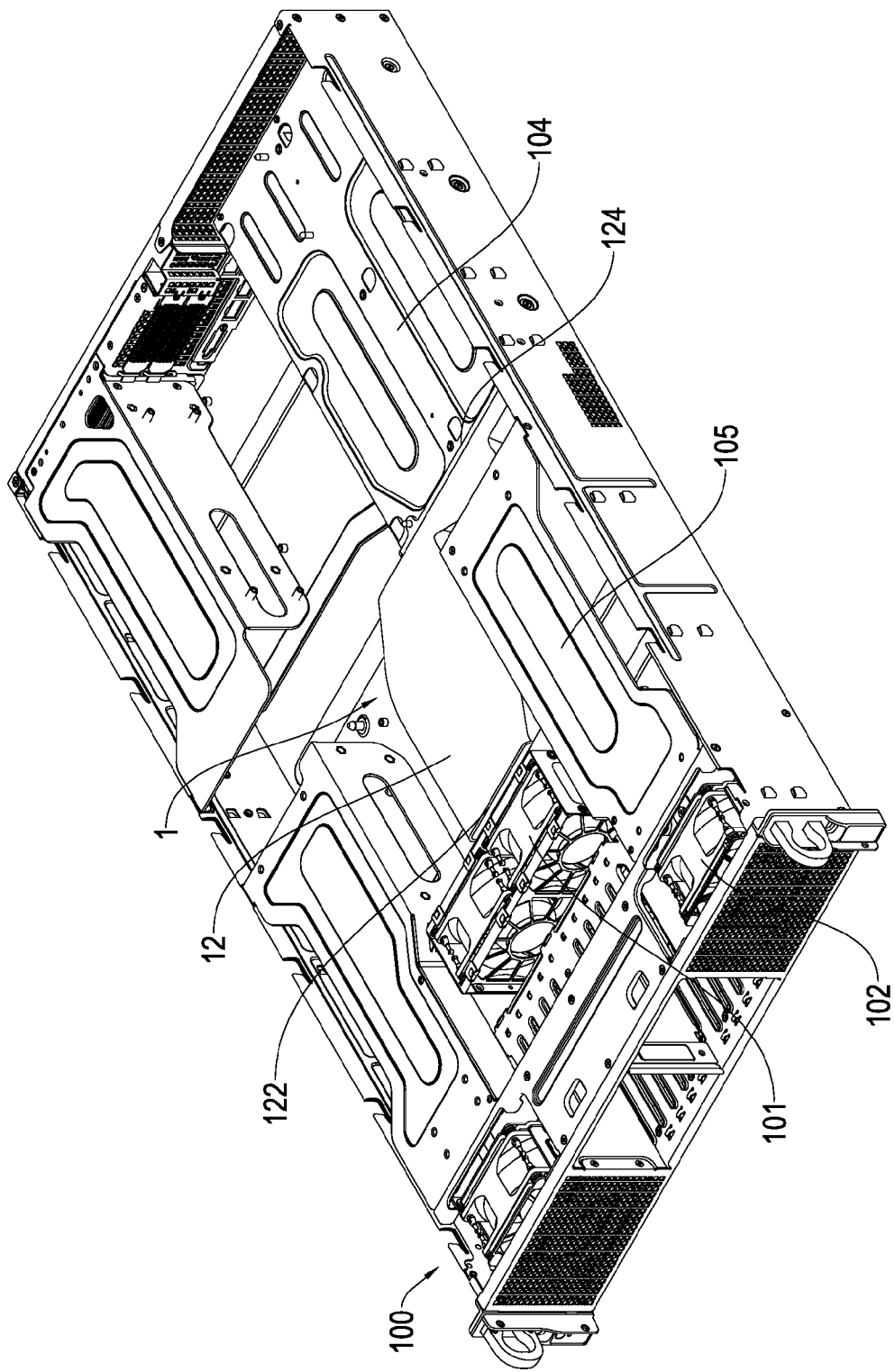
FIG. 10 is another schematic view showing the operating state of the two-layer wind-guiding shroud of the present invention.

Please refer to FIGS. 3 and 4. The present invention provides a two-layer wind-guiding shroud, which includes a base 1.

The base 1 comprises a first member 11 and a second member 12. The first member 11 has a positioning portion 13. The second member 12 is fixedly disposed above the first member 11 via the positioning portion 13. The first member 11 is formed as an arch, but it is not limited thereto. The interior of the first member 11 has a first wind-guiding channel 111 and a first wind-exiting channel 113 extending from the first wind-guiding channel 111. One side of the first wind-guiding channel 111 has a first wind entrance 112. One side of the first wind-exiting channel 113 has a first wind exit 114. The first wind exit 114 is provided with a first wind-guiding plate 115. The second member 12 is formed as an arch, but it is not limited thereto. The interior of the second member 12 has a second wind-guiding channel 121 and a second wind-exiting channel 123 extending from the second wind-guiding channel 121. One side of the second wind-guiding channel 121 has a second wind entrance 122. One side of the second wind-exiting channel 123 has a second wind exit 124. The second wind exit 124 is provided with a second wind-guiding plate 125. The first wind-guiding channel 111 and the second wind-guiding channel 121 are longitudinally overlapped with each other. The first wind entrance 112 and the second wind entrance 122 are vertically juxtaposed to each other. The first wind-exiting channel 113 and the second wind-exiting channel 123 are staggered in such a manner that they are not longitudinally juxtaposed to each other. In this way, the first wind exit 114 and the second wind exit 124 are staggered. Further, the base 1 is provided with a stopping plate 14 on the edges opposite to the second wind entrance 122 respectively.

FIGS. 5 to 8 are assembled views showing the two-layer wind-guiding shroud of the present invention. The base 1 comprises a first member 11 and a second member 12. The second member 12 is fixedly disposed above the first member 11 via the positioning portion 13. The interior of the first member 11 has the first wind-guiding channel 111 and the first wind-exiting channel 113. The first wind entrance 112 is formed on one side of the first wind-guiding channel 111. The first wind exit 114 is formed on one side of the first wind-exiting channel 113. The interior of the second member 12 has the second wind-guiding channel 121 and the second wind-exiting channel 123. The second wind entrance 122 is formed on one side of the second wind-guiding channel 121. The second wind exit 124 is formed on one side of the second wind-exiting channel 123.

Alternatively, the base 1 may be integrally formed with a first member 11 and a second member 12. The second member 12 is integrally connected above the first member 11. The interior of the first member 11 has the first wind-guiding channel 111 and the first wind-exiting channel 113. The first wind entrance 112 is formed on one side of the first wind-guiding channel 111. The first wind exit 114 is formed on one side of the first wind-exiting channel 113. The interior of the second member 12 has the second wind-guiding channel 121 and the second wind-exiting channel 123. The second wind entrance 122 is formed on one side of the second wind-guiding channel 121. The second wind exit 124 is formed on one side of the second wind-exiting channel 123.

The first wind-guiding channel 111 and the second wind-guiding channel 121 are longitudinally overlapped with each other. The first wind entrance 112 and the second wind entrance 122 are vertically juxtaposed to each other. The first wind-exiting channel 113 and the second wind-exiting channel 123 are staggered in such a manner that they are not longitudinally juxtaposed to each other. In this way, the first wind exit 114 and the second wind exit 124 are staggered. Further, the base 1 is provided with a stopping plate 14 on the edges opposite to the second wind entrance 122 respectively. The stopping plate 14 can be formed by extending from one side of the first member 11 or one side of the second member 12.

Please refer to FIGS. 9 to 12. The two-layer wind-guiding shroud of the present invention is installed inside an electronic device 100. The electronic device 100 comprises a first fan 101, a second fan 102, a first heat-generating element 103, a second heat-generating element 104, and a third heat-generating element 105. The first wind entrance 112 and the second wind entrance 122 that are juxtaposed vertically to each other are arranged to correspond to the first fan 101. The first heat-generating element 103 is accommodated in the first wind-guiding channel 111. The second wind exit 124 is arranged to correspond to the second heat-generating element 104. The second fan 102 is arranged on one side of the third heat-dissipating element 105. The stopping plate 14 is arranged to correspond to the other side of the third heat-generating element 105. The arrangement of the two-layer wind-guiding shroud of the present invention and the heat-generating elements is not limited to the above embodiment and can be adjusted based on practical demands.

Figure 11:
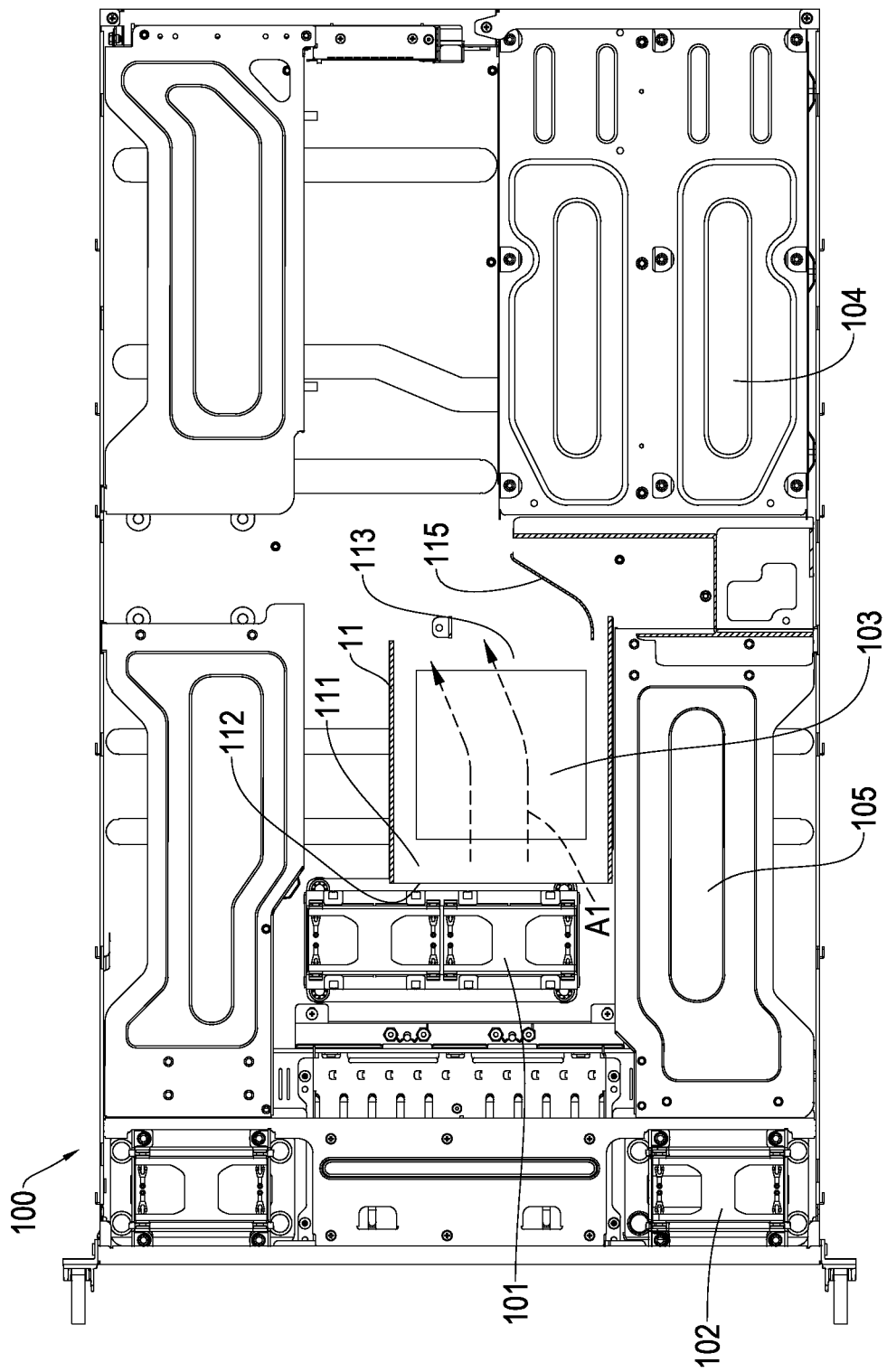
FIG. 11 is a further schematic view showing the operating state of the two-layer wind-guiding shroud of the present invention.

As shown in FIG. 11, a first airflow A1 generated by the first fan 101 flows into the first wind-guiding channel 111 via the first wind entrance 112. The first airflow A1 flows through the first wind-guiding channel 111 toward the first heat-generating element 103, thereby dissipating the heat generated by the first heat-generating element 103 and lowering its temperature. Finally, the first airflow A1 heat-exchanged with the first heat-generating element 103 is guided to exit the first wind exit 114 via the first wind-guiding plate 115 near the first wind exit 114.

Figure 12:
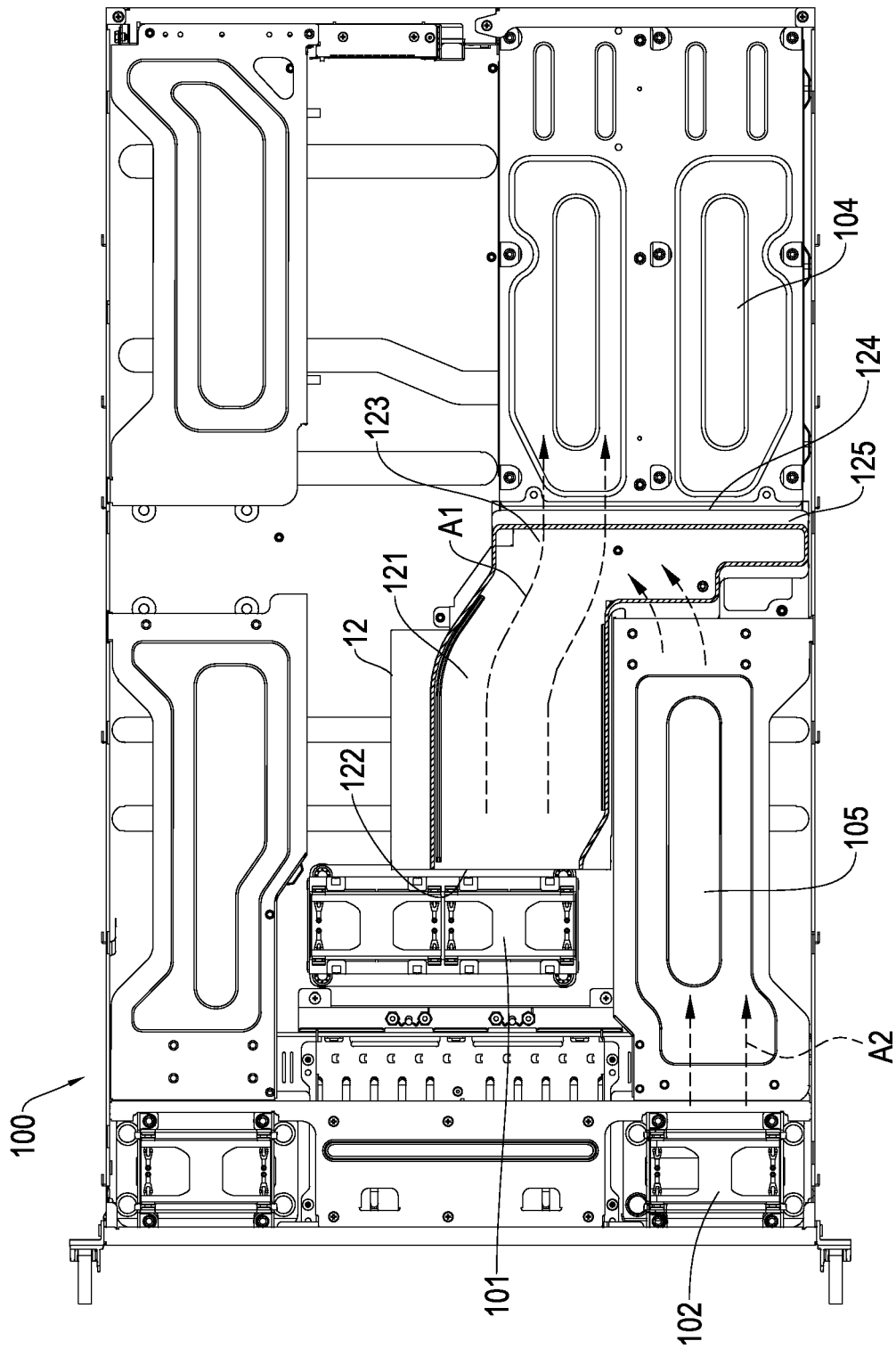
FIG. 12 is still a further schematic view showing the operating state of the two-layer wind-guiding shroud of the present invention.

Further, as shown in FIG. 12, the first airflow A1 flows into the first wind-guiding channel 111 via the second wind entrance 122 and exits the second wind exit 124. The second wind exit 124 is arranged to correspond to the second heat-generating element 104. The second wind exit 124 is provided with a second wind-guiding plate 125 facing downwards, so that the first airflow A1 can flow toward the second heat-generating element 104 via the second wind exit 124, thereby dissipating the heat generated by the second heat-generating element 104 and lowering its temperature. The second fan 102 generates a second airflow A2 flowing toward the third heat-generating element 105, so that the second airflow A2 flowing toward the third heat-generating element 105 absorbs heat to become hot. The stopping plate 14 is provided on the other side of the second fan 102, and the stopping plate 14 is formed on the edge of the base 1 opposite to the second wind entrance 122, thereby preventing the hot second airflow A2 to flow to the second heat-generating element 104. In this way, the heat accumulated in the respective heat-generating elements and the interference between the second airflow A2 and the first airflow A1 can be avoided. Thus, the first airflow A1 can be kept to flow stably to thereby increase the heat-dissipating efficiency. The two-layer wind-guiding shroud of the present invention is configured to guide the airflows generated by the fans into different wind-guiding channels, thereby increasing the airflow paths and the heat-dissipating efficiency of the fans. In prior art, a fan and a wind-guiding shroud are arranged to correspond to one electronic element. If the heat generated by a plurality of electronic elements is to be dissipated, a plurality of fans and wind-guiding shrouds are needed, which inevitably increases the area and the complexity of the whole system. On the other hand, the fans generate vibration during their operation, so that the operating efficiency of the server will be deteriorated. Therefore, the two-layer wind-guiding shroud of the present invention employs a simple structure, a moderate area and fewer fans to dissipate the heat generated by a plurality of heat-generating elements simultaneously, thereby solving the problems of heat dissipation in a high-performance server.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A two-layer wind-guiding shroud having a base, the interior of the base including a first wind-guiding channel and a second wind-guiding channel longitudinally overlapped with each other, the first wind-guiding channel having a first wind entrance and a first wind exit, the second wind-guiding channel having a second wind entrance and a second wind exit, the first wind exit and the second wind exit being staggered, wherein the base is provided with a stopping plate at an edge opposite to the second wind entrance.

2. The two-layer wind-guiding shroud according to claim 1, wherein the first wind entrance is formed on one side of the first wind-guiding channel, the second win entrance is formed on one side of the second wind-guiding channel, and the first wind entrance and the second wind entrance are vertically juxtaposed to each other.

3. The two-layer wind-guiding shroud according to claim 1, wherein a first wind-exiting channel extends from the first wind-guiding channel, a second wind-exiting channel extends from the second wind-guiding channel, the first wind exit is formed on one side of the first wind-exiting channel, the second wind exit is formed on one side of the second wind-exiting channel, and the first wind-exiting channel and the second wind-exiting channel are staggered.

4. The two-layer wind-guiding shroud according to claim 3, wherein the base comprises a first member and a second member, the first member has a positioning portion, the second member is fixedly disposed above the first member via the positioning portion, the interior of the first member has the first wind-guiding channel and the first wind-exiting channel, and the interior of the second member has the second wind-guiding channel and the second wind-exiting channel.

5. The two-layer wind-guiding shroud according to claim 1, wherein the first wind exit is provided with a first wind-guiding plate.

6. The two-layer wind-guiding shroud according to claim 1, wherein the second wind exit is provided with a second wind-guiding plate.

7. A two-layer wind-guiding shroud having a base, the interior of the base including a first wind-guiding channel and a second wind-guiding channel longitudinally overlapped with each other, the first wind-guiding channel having a first wind entrance and a first wind exit, the second wind-guiding channel having a second wind entrance and a second wind exit, the first wind exit and the second wind exit being staggered, wherein the base comprises a first member and a second member, the first member has a positioning portion, the second member is fixedly disposed above the first member via the positioning portion, the interior of the first member has the first wind-guiding channel and a first wind-exiting channel, and the interior of the second member has the second wind-guiding channel and a second wind-exiting channel, and wherein the base is provided with a stopping plate at an edge opposite to the second wind entrance.

8. The two-layer wind-guiding shroud according to claim 7, wherein the stopping plate is formed by extending from one side edge of the first member.

9. The two-layer wind-guiding shroud according to claim 7, wherein the stopping plate is formed by extending from one side edge of the second member.

* * * * *